United States Patent
Nair et al.

[11] Patent Number: 5,939,941
[45] Date of Patent: Aug. 17, 1999

[54] HIGH EFFICIENCY POWER AMPLIFIER USING HITFET DRIVER CIRCUIT

[75] Inventors: Vijay K. Nair, Mesa; George N. Maracas, Phoenix; Herbert Goronkin, Tempe, all of Ariz.

[73] Assignee: Motorola, Inc., Schaumburg, Ill.

[21] Appl. No.: 08/937,775

[22] Filed: Sep. 25, 1997

[51] Int. Cl.$^6$ .............................. H03F 3/217; H03F 3/16
[52] U.S. Cl. ................. 330/251; 330/277; 330/307; 333/217
[58] Field of Search .......................... 330/207 A, 251, 330/277, 307; 333/217

[56] References Cited

U.S. PATENT DOCUMENTS

| | | | |
|---|---|---|---|
| 3,919,656 | 11/1975 | Sokal et al. | 330/251 X |
| 4,338,582 | 7/1982 | Presser | 333/217 X |
| 5,708,398 | 1/1998 | Shen et al. | 331/108 C X |

*Primary Examiner*—Steven J. Mottola
*Attorney, Agent, or Firm*—Eugene A. Parsons; William E. Koch

[57] ABSTRACT

A high efficiency power amplifier includes an integrated circuit with a heterojunction interband tunneling field effect transistor (HITFET) amplifier coupled to receive high frequency (into the GHz) RF signals. The HITFET amplifier is constructed to receive the RF signal with a given frequency at the input terminal and to produce a substantially square wave signal at the given frequency at an output terminal in response to the RF signal applied to the input terminal. The gate of a switching FET connected as a class E amplifier is coupled to the output of the HITFET for receiving the square wave signal and an impedance matching output circuit is coupled to the drain of the switching FET.

16 Claims, 4 Drawing Sheets

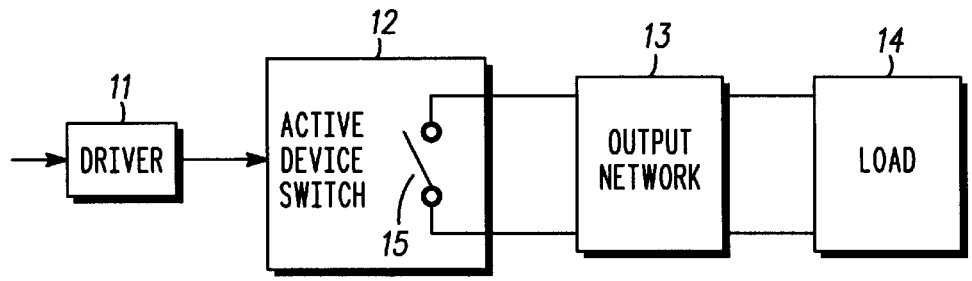
10
-PRIOR ART- *FIG. 1*
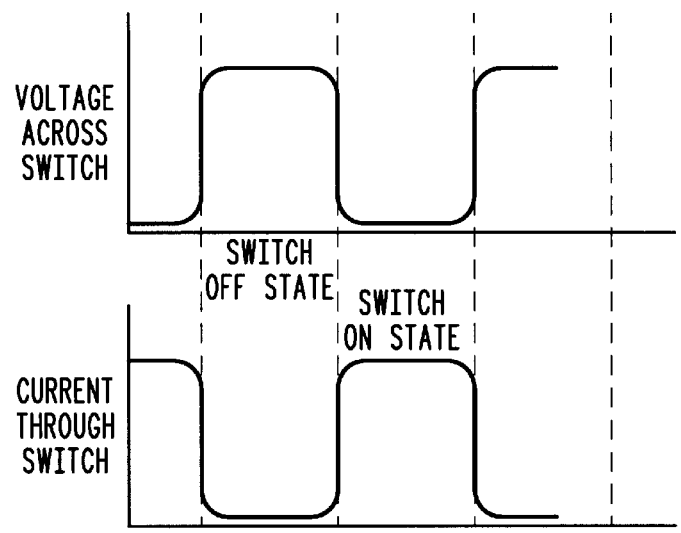
*FIG. 2*
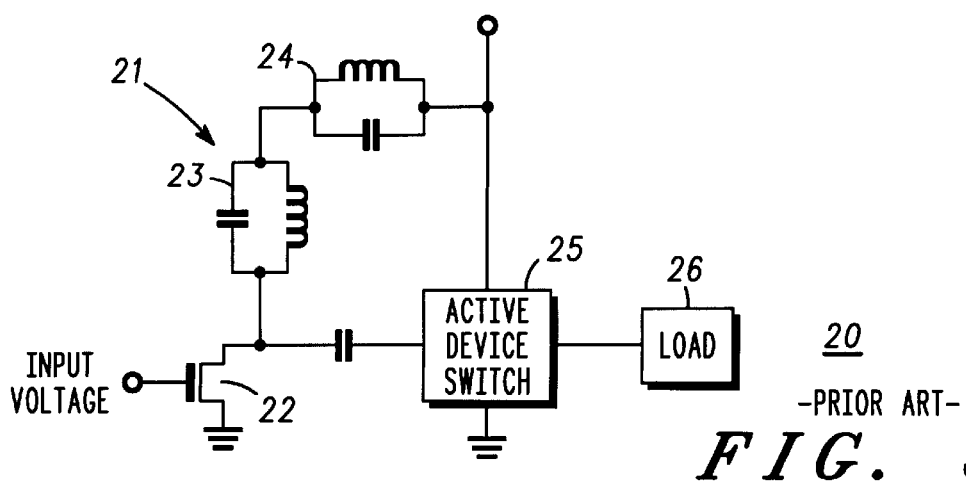
20
-PRIOR ART- *FIG. 3*

—PRIOR ART—

HIGH EFFICIENCY POWER AMPLIFIER USING HITFET DRIVER CIRCUIT

FIELD OF THE INVENTION

The present invention pertains to power amplifiers and more specifically to the efficiency of power amplifiers operating at RF frequencies into the GHz.

BACKGROUND OF THE INVENTION

Highly efficient power amplifiers operating at low voltages are required for many portable applications. At RF and microwave frequencies, power added efficiency can be improved, for example, by designing Class B, Class C, or Class E type power amplifiers. However, digital modulation schemes used in modern communication circuits require high efficiency amplifiers with high linearity. It has been shown that Class E amplifiers provide a higher efficiency and a better overall linearity than Class B or Class C amplifiers. Moreover, Class E power amplifiers, maintain the higher efficiency for larger range of output power.

However, as will be explained in more detail below, Class E amplifiers still have room for improvement. Specifically, the major power loss in an amplifier is the power dissipated by the output device.

Accordingly, it is highly desirable to provide power amplifiers with improved efficiency while retaining at least the present linearity.

It is a purpose of the present invention to provide a new and improved high efficiency power amplifier.

It is another purpose of the present invention to provide a new and improved high efficiency power amplifier which operates more efficiently than prior devices at higher frequencies.

It is still another purpose of the present invention to provide a new and improved high efficiency power amplifier with fewer tuning elements and smaller size.

SUMMARY OF THE INVENTION

The above problems and others are at least partially solved and the above purposes and others are realized in a high efficiency power amplifier including a negative differential resistance amplifier having an input terminal and an output terminal, the negative differential resistance amplifier being constructed to receive a signal with a given frequency at the input terminal and to produce a substantially square wave signal with the given frequency at the output terminal. The power amplifier further includes a semiconductor switch connected to operate as a class E amplifier and having a control input and a pair of current carrying terminals with the control input being coupled to the output terminal of the negative differential resistance amplifier for receiving the substantially square wave signal. An impedance matching output circuit is coupled to one of the current carrying terminals of the semiconductor switch to provide the output of the power amplifier.

The negative differential resistance amplifier produces a much better square wave at high frequencies than prior art devices and, therefore, switching of the class E amplifier occurs much more rapidly with less power being dissipated during the switching.

BRIEF DESCRIPTION OF THE DRAWINGS

Referring to the drawings:

FIG. 1 is a simplified block diagram generally illustrating the operation of a Class E power amplifier;

FIG. 2 illustrates an optimum waveform for the diagram of FIG. 1;

FIG. 3 is a schematic/block diagram illustrating a conventional power amplifier;

DESCRIPTION OF THE PREFERRED EMBODIMENT

Figure 4:
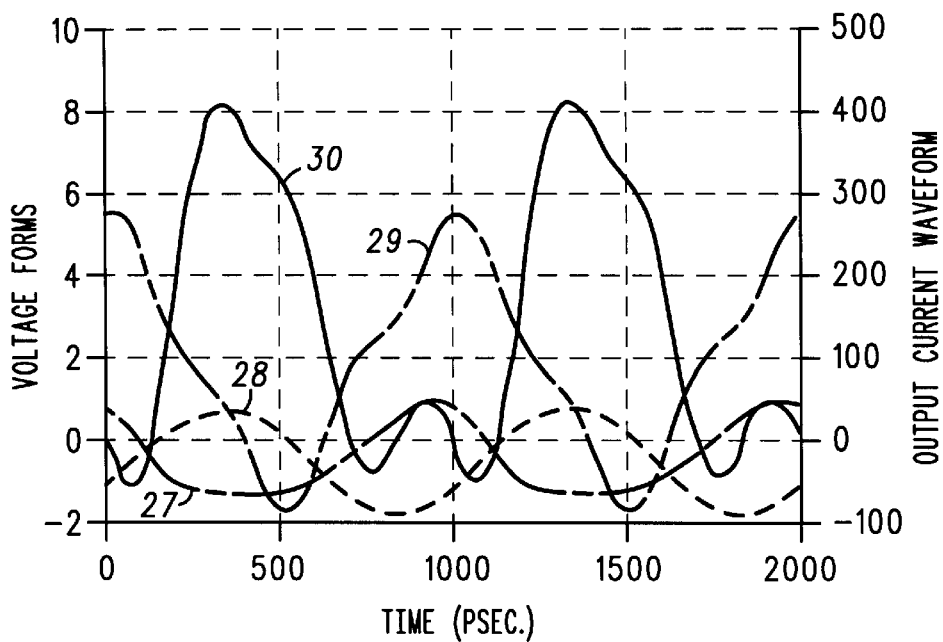
FIG. 4 illustrates input and output waveforms for the structure of FIG. 3.

Turning now to FIG. 1, a simplified block diagram is illustrated for generally describing the operation of a power amplifier 10. Power amplifier 10 includes a driver 11, an active device switch 12, an output network 13, and a load 14. Typically, active device switch 12 includes a field effect transistor (FET) which operates as a switch when properly activated by driver 11. In this simplified diagram, active device switch 12 is represented by a single-pole, single throw switch 15. As switch 15 is cyclically operated at a desired ac output frequency, the dc energy from a power supply coupled thereto is converted to RF energy at the switching frequency. The major power loss in amplifier 10 is the power dissipated by the device switch 12. To minimize this power dissipation, the following should be minimized: 1) the voltage across active device switch 12 when current is flowing through it; 2) the current flowing through active device switch 12 when a voltage is present thereacross; and 3) the duration of the time period when the voltage and current are present simultaneously at active device switch 12.

Referring to FIG. 2, desired or optimum voltage and current waveforms for power amplifier 10 are illustrated. The critical issue to improve the efficiency of power amplifier 10 dealt with in this disclosure is the generation of a suitable input waveform by driver 11 that will produce an output waveform as shown in FIG. 2. Ideally, a square waveform should be applied to active device switch 12 to minimize the transition time from the 'on' state to the 'off' state. At low frequencies driver 11 can include a variety of different circuits, including logic gates, to produce the square waveforms. However at RF and microwave frequencies, generating a square waveform by logic gates results in large power dissipation in the driver stage itself. So the traditional technique used at higher frequency ranges is to generate appropriate amounts of higher harmonics of the input frequency and add them to the fundamental to approximate a square waveform.

Turning to FIG. 3, for example, a schematic/block diagram illustrating a power amplifier 20 utilizing a conventional driver is illustrated. Power amplifier 20 has a driver 21 which includes a transistor 22 used as a nonlinear element to generate current harmonics of an input voltage applied to the gate. A first parallel tuned circuit 23, including a capacitance in parallel with an inductance, is tuned to the fundamental frequency and a second parallel tuned circuit 24, including a capacitance in parallel with an inductance, is tuned to the third harmonic frequency of an input signal. First and second parallel tuned circuits 23 and 24 are connected in series as the drain circuit of transistor 22. The fundamental and third harmonic frequencies are added in the circuit and provide an approximation of a square wave to an active device switch 25, which in turn supplies a signal of the desired frequency to a load 26. Driver 21 is generally referred to as a Class F amplifier or a harmonically tuned amplifier. It must be specifically noted that tuned circuits 23 and 24 have four tuning elements that have to be controlled precisely to generate a square-wave-like waveform. Quite often additional harmonics have to be added to shape the waveform with a more precise square shape and these additional harmonics require the addition of even more tuning elements.

Referring specifically to FIG. 4, various waveforms available in power amplifier 20 are illustrated. The input waveform applied to the gate of transistor 22 is designated 27 in FIG. 4 and has a frequency of one gigahertz. The waveform generated by driver 21 and applied to active device switch 25 is designated 28 in FIG. 4 and the resulting current flowing in active device switch 25 is designated 29 with the voltage drop thereacross being represented by a waveform designated 30. Here it can be seen that the periods during which overlap between current flowing through active switch device 25 (waveform 29) and voltage dropped across active switch device 25 (waveform 30) are substantial. In the ideal situation either the current or the voltage is zero so that power dissipated is zero (see FIG. 2). Whenever current is flowing and there is a voltage drop across a device, power is being dissipated. Thus, as can be seen in FIG. 4 there are substantial overlap areas during which substantial amounts of power are being dissipated. Primarily, FIG. 4 illustrates that the waveform generated by driver 21 (a harmonically tuned amplifier) is not close to the optimal square wave shown in FIG. 2 and begins to deteriorate substantially at higher frequencies with a substantial current flow and voltage drop and resultant power dissipation or loss.

Figure 5:
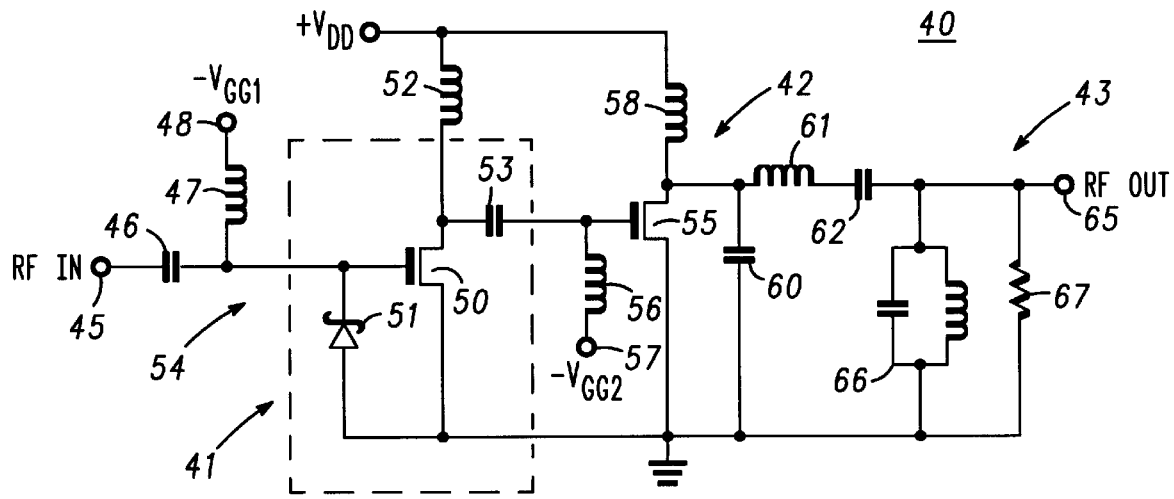
FIG. 5 is a schematic diagram of a power amplifier embodying the present invention.

Turning now to FIG. 5, a schematic diagram of a power amplifier 40 embodying the present invention is illustrated. Power amplifier 40 includes a driver 41, an active device switch 42 and an output network 43. An RF input terminal 45 is coupled through a capacitor 46 to an input of driver 41. Also, an inductance 47 is coupled from a bias supply terminal 48 to the input of driver 41. In this embodiment, bias supply terminal 48 has a bias $-V_{gg1}$ connected thereto. Generally, the input circuitry of power amplifier 40 is tuned to receive RF or microwave frequency signals in a range from high megahertz (MHz), e.g. hundreds of megahertz, to gigahertz (GHz).

Driver 41 includes a field effect transistor (FET) 50 with a gate terminal connected to one side of capacitor 46 and inductance 47 as the input. A negative differential resistance diode 51 has a cathode connected to the gate terminal of FET 50 and an anode connected to the source terminal of FET 50 and to a common potential, in this embodiment ground. In a specific embodiment, an interband tunneling diode can be utilized as diode 51, in which case FET 50 and diode 51 cooperate to form a heterojunction interband tunneling field effect transistor (HITFET). The drain terminal of FET 50 is connected through an inductance 52 to a potential source, in this embodiment $+V_{dd}$, and through a capacitor 53 to an input of active device switch 42, the entire structure being referred to herein as HITFET driver amplifier 54.

Active device switch 42 includes a field effect transistor (FET) 55 having a gate connected through capacitor 53 to driver 41. The gate of FET 55 is also connected through an inductance 56 to a second bias supply terminal 57 (in this embodiment $-V_{gg2}$). The source terminal of FET 55 is connected directly to the common, in this embodiment ground, and the drain terminal is connected through an inductance 58 to potential source $+V_{dd}$. The drain terminal of FET 55 also serves, in this embodiment, as the output terminal to output network 43.

The potential applied to potential source $+V_{dd}$ and the bias applied to bias supply terminals 48 and 57 are chosen so that driver 41 is biased to operate in the negative resistance region of the device. When an RF input is present at terminal 45, driver 41 behaves like a squarewave generator. The novel construction and application of driver 41 eliminates the need for the tuned circuits required in prior art harmonically tuned amplifiers and generates waveforms that are essentially ideal for triggering the input of a Class E amplifier, such as active device switch 42.

Output network 43 is generally an impedance matching network to allow the RF power at the fundamental frequency to pass through to the next stage and can be constructed in a variety of different embodiments. In this specific embodiment, output network 43 includes a capacitor 60 connected from the drain of FET 55 (the output terminal of active device switch 42) to the common or ground. An inductance 61 and a capacitor 62 are connected in series between the drain of FET 55 and an RF output terminal 65. A parallel tuned circuit 66 and an impedance, illustrated as an output load resistance 67, are connected in parallel between output terminal 65 and the common or ground to allow the RF power at the fundamental frequency to pass through to output load resistance 67 and to trap the higher harmonics.

Figure 6:
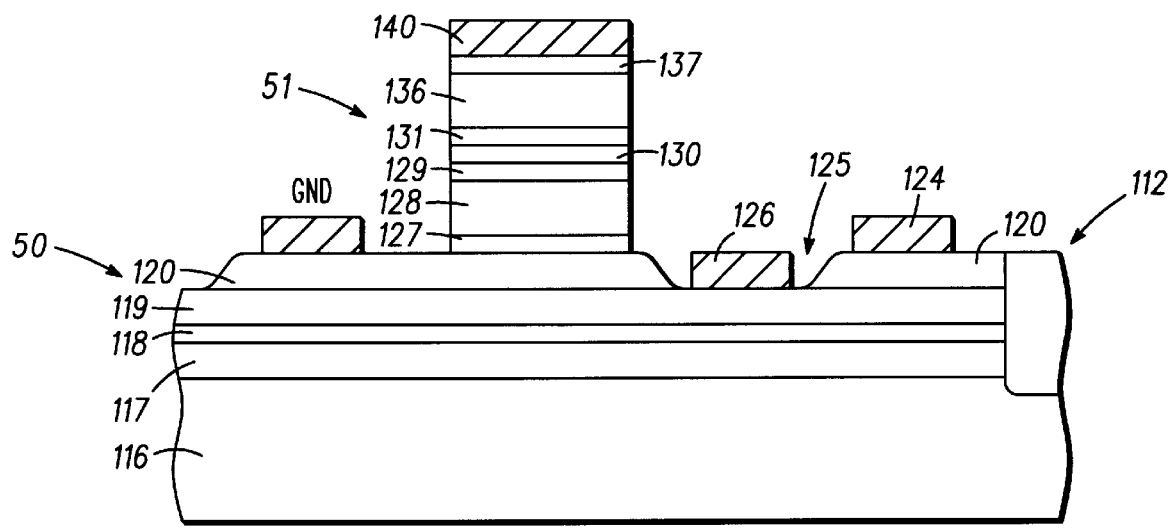
FIG. 6 is a simplified sectional view of a heterojunction interband tunneling field effect transistor (HITFET) including an integrated negative differential resistance diode and a field effect transistor in accordance with the present invention.

Turning now to FIG. 6, a simplified sectional view of the HITFET including heterojunction field-effect transistor 50 formed of a gallium arsenide based material system and resonant tunneling diode 51 is illustrated. For convenience in understanding, components in FIG. 6 which are similar to components in FIG. 5 are designated with the same numbers.

One method of fabricating the HITFET (HFET 50 and RTD 51) of FIG. 6 is to provide a substrate 116 having a heterostructure of layers of material grown on a planar surface thereof. While specific materials in a specific material system and specific layer thicknesses are utilized herein for example, it will be understood that some changes may be made without effecting the purpose herein described. Substrate 116 is formed of semi-insulating gallium arsenide (GaAs). A buffer layer 117 of gallium arsenide (GaAs) is epitaxially grown on the planar surface thereof to reduce crystal stress in subsequent layers. A channel layer 118 of indium gallium arsenide (InGaAs) is epitaxially grown on the surface of buffer layer 117. A supply layer 119 of aluminum gallium arsenide (AlGaAs) is grown on the surface of channel layer 118. A relatively heavily doped contact layer 120 of GaAs is grown on the surface of supply layer 119. Layer 120 is doped, for example, with silicon ions or the like to a density of approximately $2 \times 10^{18}$ cm$^{-3}$ to provide relatively good conductivity, for reasons that will become apparent presently.

At this point several different methods of fabrication may be utilized, depending primarily on the sequence of the following steps. Thus, a first method of fabrication will be described with some possible variations in the sequence of steps explained later.

An etch stop layer 127 of aluminum arsenide (AlAs) is grown on the surface of contact layer 120. A first resonant tunneling, or transition, layer 128 of indium aluminum arsenide (InAlAs) is grown on the surface of etch stop layer 127. A first relatively thin (approximately 25 Å–50 Å) barrier layer 129 of indium gallium arsenide (InGaAs) is epitaxially grown on the surface of InAlAs resonant tunneling layer 128, followed by a quantum well layer 130 of InAlAs (preferably 15 Å–25 Å thick), and, in turn, followed by a second relatively thin barrier layer 131 of InGaAs to complete diode 51. A second relatively heavily doped layer 136 of InAlAs is epitaxially grown on barrier layer 131 followed by a final contact layer 137 of heavily doped InGaAs.

The epitaxial structure is formed into HFET 50 and RTD 51 in one fabrication method by etching and properly applying external contacts as follows. A first ohmic contact 140 is formed with final InGaAs layer 137. Using contact 140 as a mask, the upper layers, i.e. layers 128–136 are etched down to etch stop layer 127. The etched mesa formed by ohmic contact 140 and layers 128–136, illustrated in FIG. 6, form RTD 51.

As is also illustrated in FIG. 6, a second ohmic contact 124 is formed with heavily doped GaAs contact layer 120, in spaced relationship to RTD 51, by some convenient method. Both of the contacts 140 and 124 are formed of some convenient metal system, such as nickel-gold-germanium (NiAuGe) which is applied by any convenient method, such as evaporation and lift-off. A gate contact area 125 is defined between contact 124 and the mesa, using some convenient method such as mask and photoresist. Heavily doped GaAs contact layer 120 is removed by etching or the like in gate contact area 125 and a Schottky metal contact 126 is formed on the exposed upper surface of supply layer 119 in gate contact area 125. Resonant tunneling diode 51 is formed on the source of HFET 50, for convenience in fabrication and the common connection at layer 120 is connected to ground, as illustrated schematically in FIG. 5. Further, contacts 140 and 126 are connected together and to output capacitor 46, as will be seen presently. While this specific embodiment illustrates the driver amplifier as including a heterojunction field effect transistor, it will be understood by those skilled in the art that many other types of transistors can be utilized and that the heterojunction field effect transistor is only being used for purposes of this description. Additional information on GaAs based FETs can be found in U.S. Pat. No. 5,477,169, entitled "Logic Circuit With Negative Differential Resistance" and issued Dec. 19, 1995.

Figure 7:
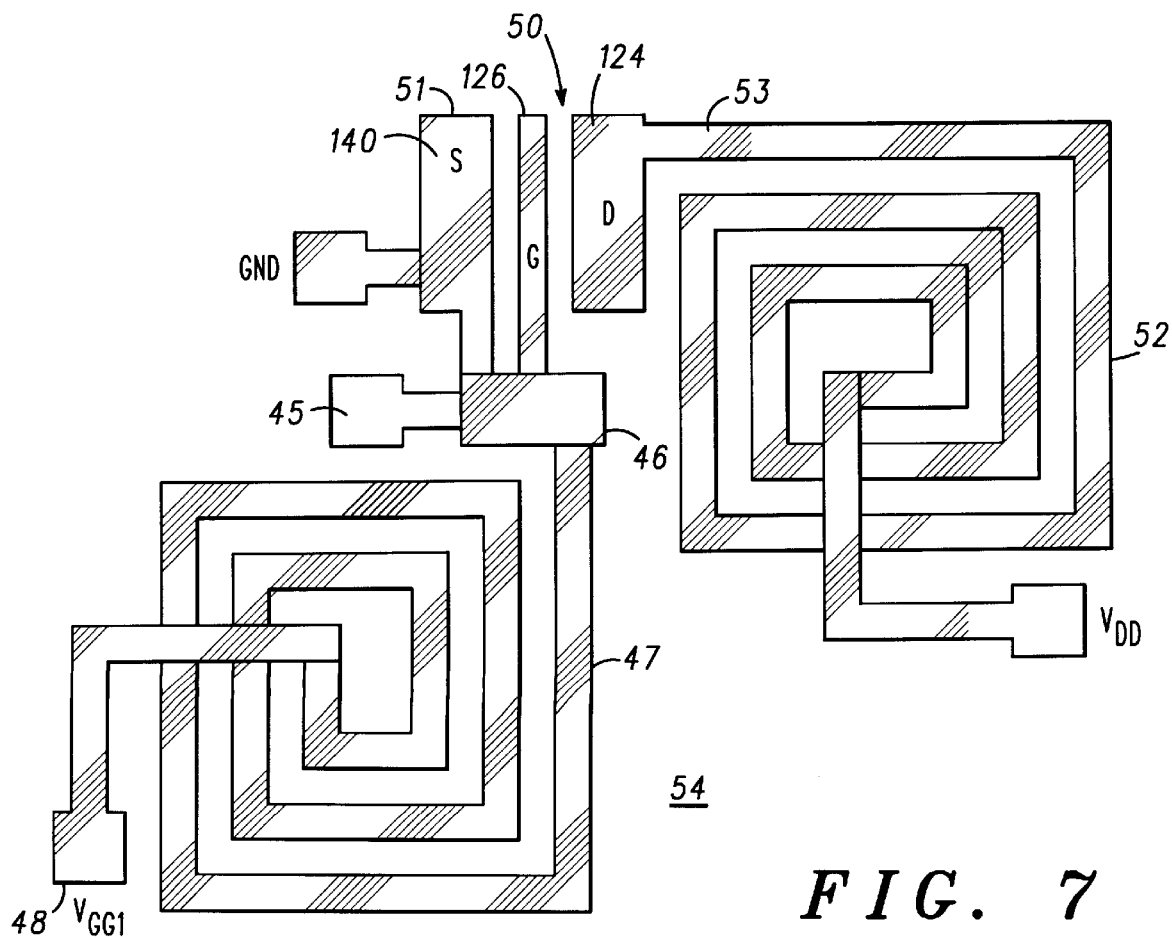
FIG. 7 is a simplified view in top plan of components of a negative differential amplifier utilizing the integrated device of FIG. 6, in accordance with the present invention.

Turning now to FIG. 7, a top plan view is illustrated of HITFET driver amplifier 54 utilizing the HITFET of FIG. 6, in accordance with the present invention. It will of course be understood that the HITFET of FIG. 6 is being utilized for example only and many other devices including a different field effect transistor with a variety of negative differential resistance diodes could be utilized. Amplifier 54 includes HFET 50, resonant tunneling diode 51, inductance 47 and capacitance 46, and inductance 52 and capacitance 53.

One terminal of resonant tunneling diode 51 is connected to the source of HFET 50 and the other terminal of resonant tunneling diodes 51 (contact 140) is connected to gate contact 126 of HFET 50. Gate contact 126 of HFET 50 is also connected to one end of inductance 47, which is formed on the substrate of HFET 50, and to one side of capacitor 46. Drain contact 124 of HFET 50 is connected to inductance 52, which is formed on the substrate of HFET 50 to completely integrate the circuit. Drain contact 124 of HFET 50 is also connected to one side of capacitor 53, the other side of which serves as an output for amplifier 54. Terminals 48 and $V_{dd}$ of inductances 47 and 52, respectively, are externally available for the application of suitable control voltages, as explained above. Also, capacitances 46 and 53, which are formed as a part of the integrated circuit. Capacitance 46 is connected to terminal 45 and capacitance 53 is connected to the drain of HFET 50 to complete amplifier 54.

Figure 8:
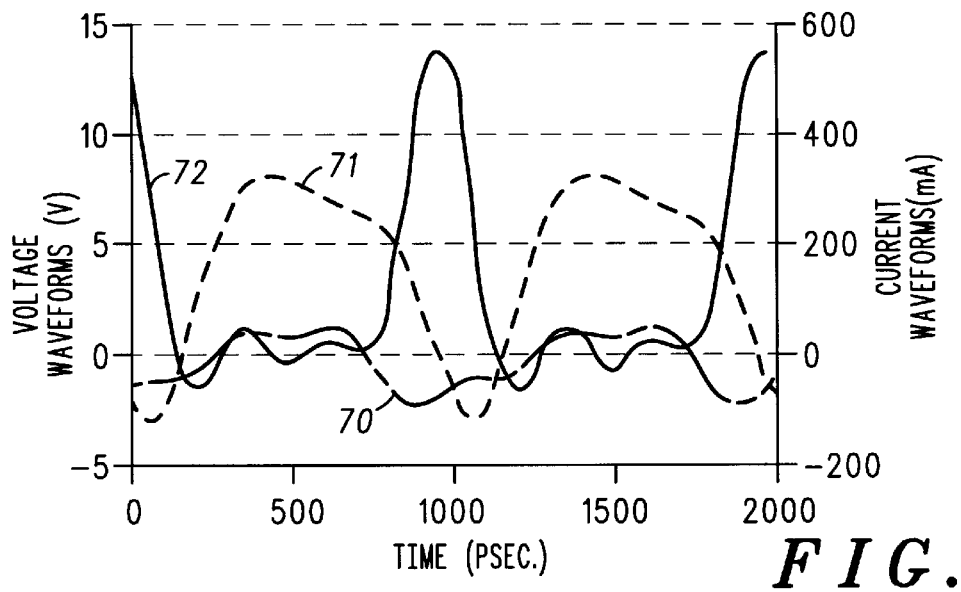
FIG. 8 illustrates input and output waveforms for the structure of FIG. 7.

Referring now to FIG. 8, input and output waveforms to power amplifier 40 of FIG. 5 are illustrated. In this example, the input signal (not shown) is again a one gigahertz RF signal. The square waveform generated by driver 41 is represented by the waveform designated 70, which square waveform is distorted due to time constants associated with interstage elements 53 and 56. The resulting current flowing in active device switch 42 is represented by a waveform designated 71 and the voltage drop is represented by a waveform designated 72. Here it can be seen that the periods during which overlap between current flowing through active switch device 42 (waveform 71) and voltage (waveform 72) across active switch device 42 are greatly reduced in size, which substantially reduces dissipated power. In a specific circuit design, in which driver 41, active device switch 42 and output network 43 were all integrated on a common substrate, the efficiency improved by about 6% and the output power improved by about 2.5 dBm. Further testing showed that when output network 43 is not integrated but is attached off-chip using high-Q components, the efficiency of power amplifier 40 increased to over 83%.

Figure 9:
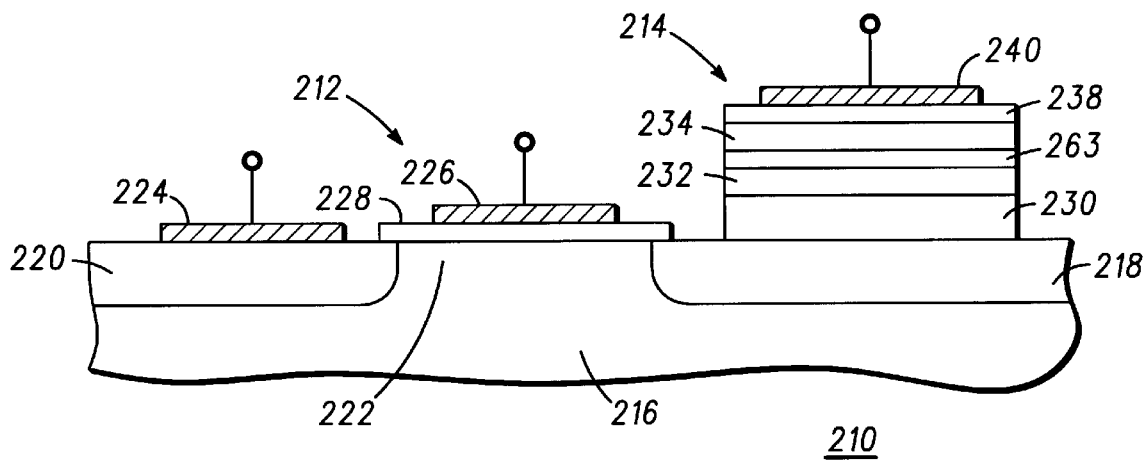
FIG. 9 is a simplified sectional view of another integrated negative differential resistance diode and a field effect transistor in accordance with the present invention.

Turning now to FIG. 9, another specific embodiment is illustrated of a FET and a negative resistance diode whereby any or all of power amplifier 40 can be integrated onto a single substrate. FIG. 9 illustrates a resonant tunneling field-effect transistor generally designated by the reference character 210. Resonant tunneling field-effect transistor 210 includes a field-effect transistor 212 formed of a silicon based material system and a resonant tunneling device 214. In this specific embodiment, field-effect transistor 212 is a conventional metal-oxide-semiconductor field-effect transistor (MOSFET) having a silicon substrate 216 in which a source 218 and drain 220 are formed. Source 218 and drain 220 are formed by the addition of dopant material to specific areas of substrate 216 using conventional technology such as diffusion or implantation, etc. and are separated by a channel region 222. In this example, source 216 and drain 218 are a n+ type conductivity while substrate 216, and specifically channel region 222 is a p type conductivity. A drain electrode 224 is formed on drain 220 and a gate electrode 226 is formed over channel region 222 and separated therefrom by a silicon dioxide layer 228.

It will of course be understood by those skilled in the art that silicon based FET 212 is illustrated for example and other FETs (as well as other types of transistors), such as Gallium Arsenide based structures, could also be used. In such devices the channel and buffer layers are grown epitaxially, rather than being diffused or implanted. However, the operation is basically the same. Additional information on Si based FETs can be found in a copending patent application entitled "Resonant Tunneling Field Effect Transistor" bearing Ser. No. 08/625,667 and filed on Mar. 29, 1996.

Resonant tunneling device 214 is operably positioned on source 218 of field-effect transistor 212 and defines an externally accessible contact. In this specific embodiment, resonant tunneling device 214 is formed of a silicon based material system. Specifically, a conduction layer 230 having a first conductivity is positioned on substrate 216 overlying source 218, a pair of quantum well layers 232 and 234 are positioned on conductive layer 230, separated by a barrier layer 236, and another conduction layer 238 having a second conductivity is positioned on quantum well layer 234 so as to sandwich quantum well layers 232 and 234 and barrier layer 236 between conductive layers 230 and 238.

Conductive layer 238 is heavily doped with a p dopant to form a p++ type conductivity, while conductive layer 230 is heavily doped with an n dopant to form a n++ type dopant. A source electrode 240 is formed on conductive layer 238 to provide an external contact for resonant tunneling device 214 and therefore for field-effect transistor 212. In the specific embodiment illustrated, quantum well layers 232 and 234 are formed of GeSi, and conductive layers 230 and 238 are formed of Si.

Figure 10:
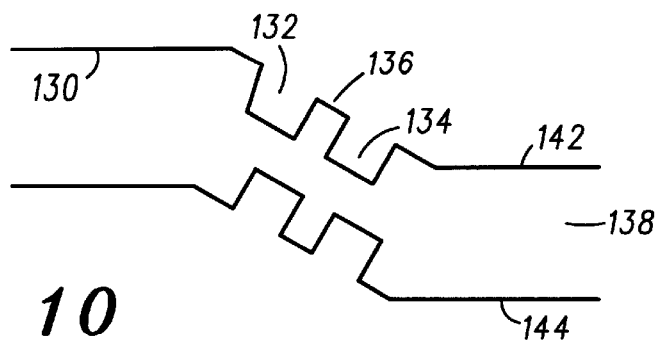
FIG. 10 is an energy diagram for the device of FIG. 9.

Referring to FIG. 10, an energy band diagram illustrating a conductive band, represented by a line 242, and a valence band, represented by a line 244, of resonant tunneling device 214 is shown. Starting on the left, the band gap of conductive layer 230 is shown with quantum well 232 adjacent thereto. Quantum well 232 is separated from quantum well 234 by barrier layer 236 with conductive layer 238 adjacent to quantum well 234 on the right. As illustrated, resonant tunneling device 214 is biased to shift the energy band downwardly as illustrated in FIG. 10 to allow carrier flow in a manner well known to those skilled in the art. As will be understood by those skilled in the art, utilizing a silicon material system to fabricate the driver amplifier allows the easy integration of the present device into standard silicon circuitry.

Thus, a new and improved power amplifier is disclosed with improved efficiency while retaining at least the linearity available in prior art types of power amplifiers. Also, the new and improved high efficiency power amplifier requires fewer tuning elements, and specifically does not require the harmonic tuned circuits required in prior art power amplifiers. The new power amplifier has a much smaller size than comparable prior art devices and can be easily and conveniently integrated onto a semiconductor substrate along with cooperating stages or components. Because of a substantial reduction in the dissipation of power during switching of the new power amplifier, not only is the efficiency substantially increased but the output power is also increased.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A high efficiency power amplifier comprising:
   a negative differential resistance amplifier having an input terminal and an output terminal, the negative differential resistance amplifier being constructed to receive a signal with a given frequency at the input terminal and to produce a substantially square wave signal with the given frequency at the output terminal;
   a semiconductor switch having a control input and a pair of current carrying terminals, the control input being coupled to the output terminal of the negative differential resistance amplifier for receiving the substantially square wave signal; and
   an impedance matching output circuit coupled to one of the current carrying terminals of the semiconductor switch.

2. A high efficiency power amplifier as claimed in claim 1 wherein the negative differential resistance amplifier includes a heterojunction interband tunneling field effect transistor.

3. A high efficiency power amplifier as claimed in claim 1 wherein the negative differential resistance amplifier includes a three terminal transistor with a negative differential resistance diode coupled to a first terminal of the three terminal transistor and an inductance coupled to a second terminal of the three terminal transistor.

4. A high efficiency power amplifier as claimed in claim 3 wherein the negative differential resistance diode is an interband tunneling diode.

5. A high efficiency power amplifier as claimed in claim 1 wherein the negative differential resistance amplifier includes a field effect transistor having gate, drain and source terminals, a negative differential resistance diode coupled to the gate terminal of the transistor, a first inductance coupled to the gate terminal of the transistor, a second inductance coupled to the drain terminal of the transistor, and operating voltages which set the amplifier to operating in a negative differential resistance region of the diode connected through the first and second inductances to the gate and drain terminals respectively.

6. A high efficiency power amplifier as claimed in claim 1 wherein the semiconductor switch includes a field effect transistor.

7. A high efficiency power amplifier as claimed in claim 1 wherein the negative differential resistance amplifier and the semiconductor switch are integrated on a common substrate.

8. A high efficiency power amplifier as claimed in claim 7 wherein the impedance matching output circuit is integrated on a common substrate with the negative differential resistance amplifier and the semiconductor switch.

9. A high efficiency power amplifier as claimed in claim 1 wherein the input terminal of the negative differential resistance amplifier is constructed to receive an RF signal with a frequency in the range of high MHz to GHz.

10. A high efficiency power amplifier comprising: an integrated circuit including
    a heterojunction interband tunneling field effect transistor amplifier having an input terminal for receiving RF signals and an output terminal, the heterojunction interband tunneling field effect transistor amplifier being constructed to receive an RF signal with a given frequency at the input terminal and to produce a substantially square wave signal with the given frequency at the output terminal,
    a semiconductor switch including a field effect transistor having a gate terminal and drain and source terminals, the gate terminal being coupled to the output terminal of the heterojunction interband tunneling field effect transistor amplifier for receiving the substantially square wave signal; and
    an impedance matching output circuit coupled to the drain terminal of the field effect transistor.

11. A high efficiency power amplifier as claimed in claim 10 wherein the impedance matching output circuit is included in the integrated circuit with the heterojunction interband tunneling field effect transistor amplifier and the semiconductor switch.

12. A high efficiency power amplifier as claimed in claim 10 wherein the input terminal of the heterojunction interband tunneling field effect transistor amplifier is constructed to receive an RF signal with a frequency in the range of high MHz to GHz.

13. A high efficiency power amplifier comprising:

a negative differential resistance amplifier including a field effect transistor having an RF input gate terminal and drain and source terminals, a negative differential resistance diode coupled to the RF input gate terminal of the transistor, a first inductance coupled to the RF input gate terminal of the transistor, a second inductance coupled to the drain terminal of the transistor, and operating voltages which set the amplifier to operating in a negative differential resistance region of the diode connected through the first and second inductances to the RF input gate terminal and the drain terminal respectively, the negative differential resistance amplifier being constructed to receive a signal with a given frequency at the RF input gate terminal and to produce a substantially square wave signal with the given frequency at an output terminal;

a semiconductor switch including a switching field effect transistor having a switching gate terminal and drain and source terminals, the switching gate terminal being coupled to the output terminal of the negative differential resistance amplifier for receiving the substantially square wave signal; and an impedance matching output circuit coupled to the drain terminal of the switching field effect transistor.

14. A high efficiency power amplifier as claimed in claim 13 wherein the negative differential resistance amplifier and the semiconductor switch are integrated on a common substrate.

15. A high efficiency power amplifier as claimed in claim 14 wherein the impedance matching output circuit is included in the integrated circuit with the negative differential resistance amplifier and the semiconductor switch.

16. A high efficiency power amplifier as claimed in claim 13 wherein the input terminal of the negative differential resistance amplifier is constructed to receive an RF signal with a frequency in the range of high MHz to GHz.

* * * * *